United States Patent [19]
Watanabe et al.

[11] Patent Number: 5,552,628
[45] Date of Patent: Sep. 3, 1996

[54] SEMICONDUCTOR DEVICE AND METHOD OF MANUFACTURING THE SAME

[75] Inventors: Tohru Watanabe; Katsuya Okumura, both of Yokohama, Japan

[73] Assignee: Kabushiki Kaisha Toshiba, Kawasaki, Japan

[21] Appl. No.: 389,563

[22] Filed: Feb. 16, 1995

Related U.S. Application Data

[63] Continuation of Ser. No. 82,504, Jun. 25, 1993, abandoned, which is a continuation of Ser. No. 984,720, Dec. 4, 1992, abandoned, which is a continuation of Ser. No. 679,491, Apr. 2, 1991, abandoned.

[30] Foreign Application Priority Data

Apr. 2, 1990 [JP] Japan ..................................... 2-84947
Dec. 17, 1990 [JP] Japan ................................... 2-418924

[51] Int. Cl.⁶ ............................. H01L 23/58; H01L 23/48
[52] U.S. Cl. ......................... 257/632; 257/637; 257/758; 257/760
[58] Field of Search .................. 357/54, 59, 52, 357/67, 71; 257/632, 635, 637, 638, 758, 760

[56] References Cited

U.S. PATENT DOCUMENTS

| | | | |
|---|---|---|---|
| 4,907,066 | 3/1990 | Thomas et al. | 257/741 |
| 5,060,050 | 10/1991 | Tsuneoka et al. | 357/71 |
| 5,236,874 | 8/1993 | Pintchovski | 437/245 |
| 5,354,387 | 10/1994 | Lee et al. | 437/235 |

OTHER PUBLICATIONS

"Physical and Chemical Properties of Silicon Dioxide Film Deposited By New Process," Proceedings 1987 Fall Meeting of The Materials Research Society, Boston, MA Nov. 30–Dec. 5, 1987 by Goda et al.

*Primary Examiner*—Mark V. Prenty
*Attorney, Agent, or Firm*—Finnegan, Henderson, Farabow, Garrett & Dunner, L.L.P.

[57] ABSTRACT

A semiconductor device of the present invention comprises a silicon substrate, a silicon oxide layer formed on the silicon substrate, first aluminum wires formed on the silicon oxide layer, a CVD $SiO_2$ layer covering at least the first aluminum wires, and an inorganic oxide precipitated from a liquid-phase material, the inorganic oxide filling at least a gap between the first aluminum wires.

85 Claims, 14 Drawing Sheets

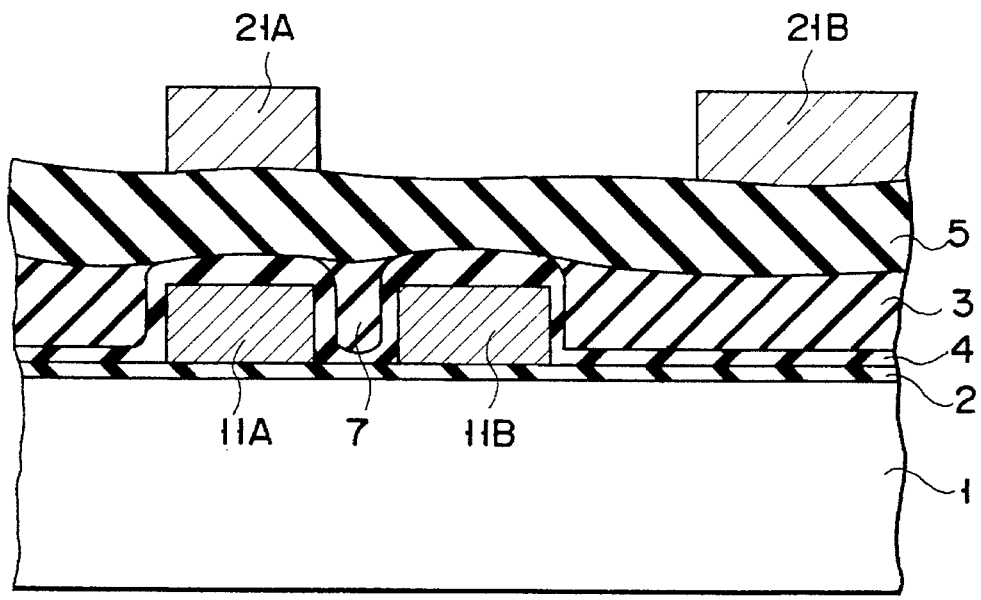
F I G. 4
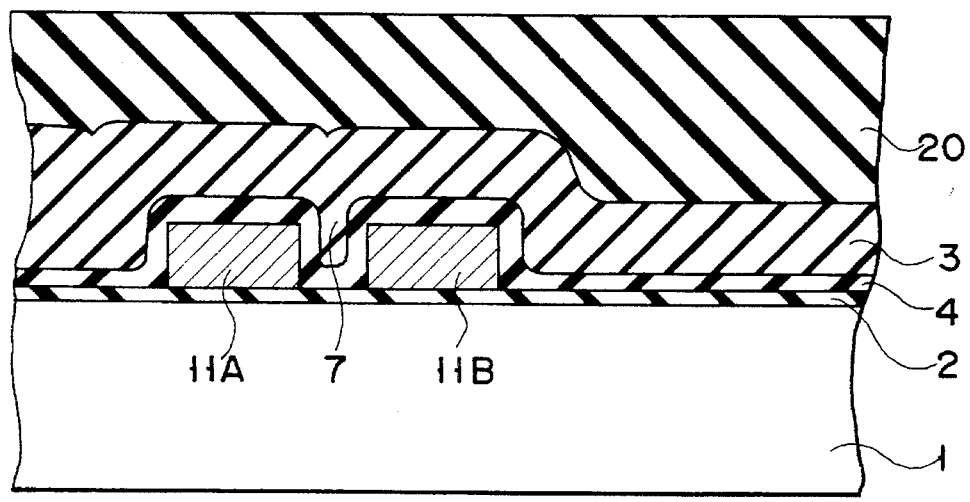
F I G. 5A

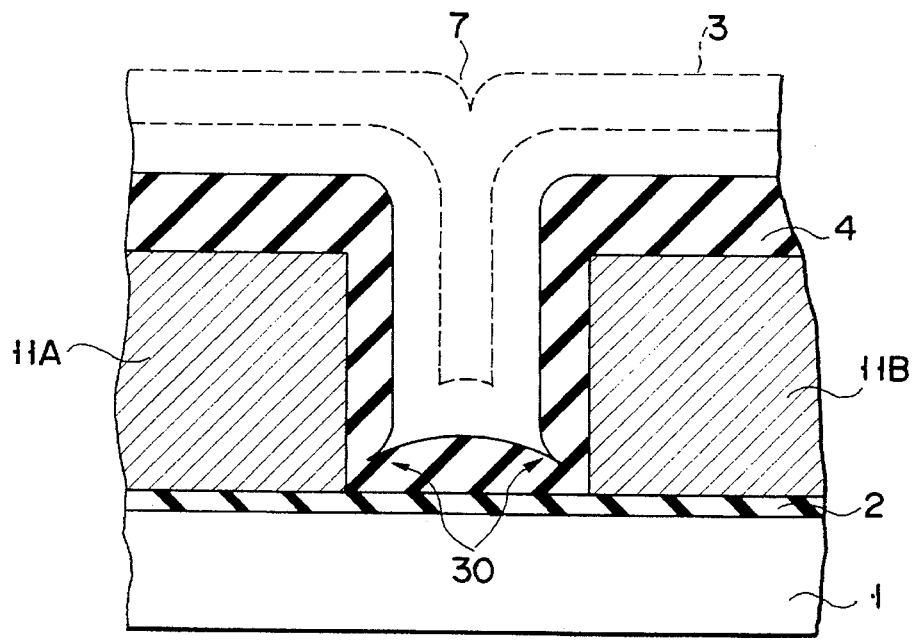
F I G. 6
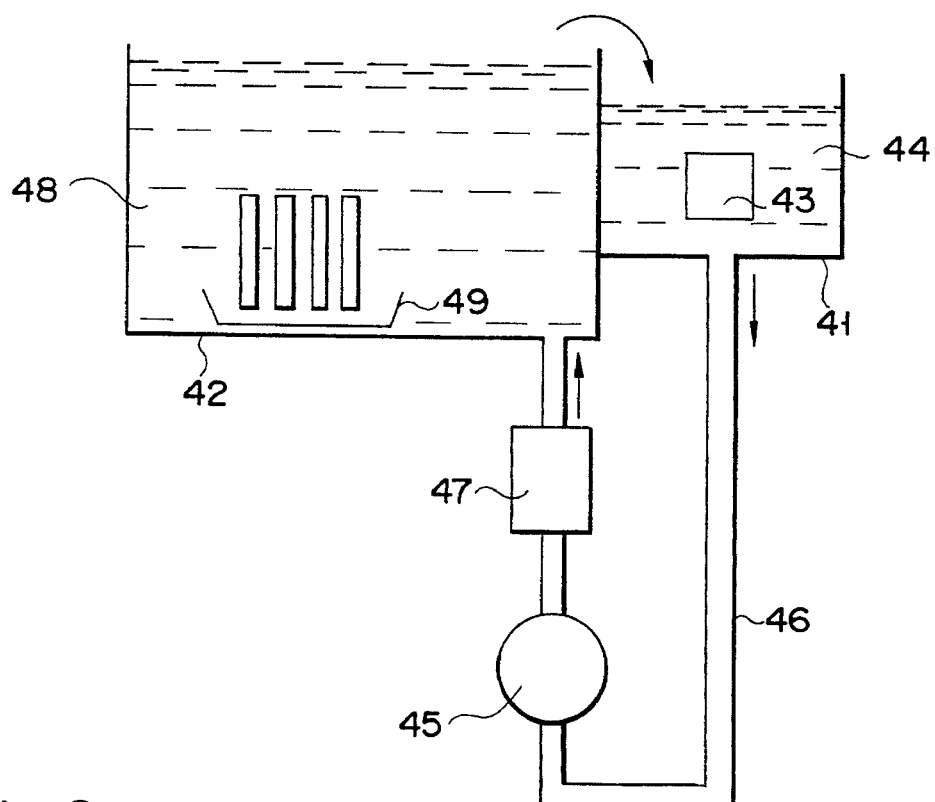
F I G. 7

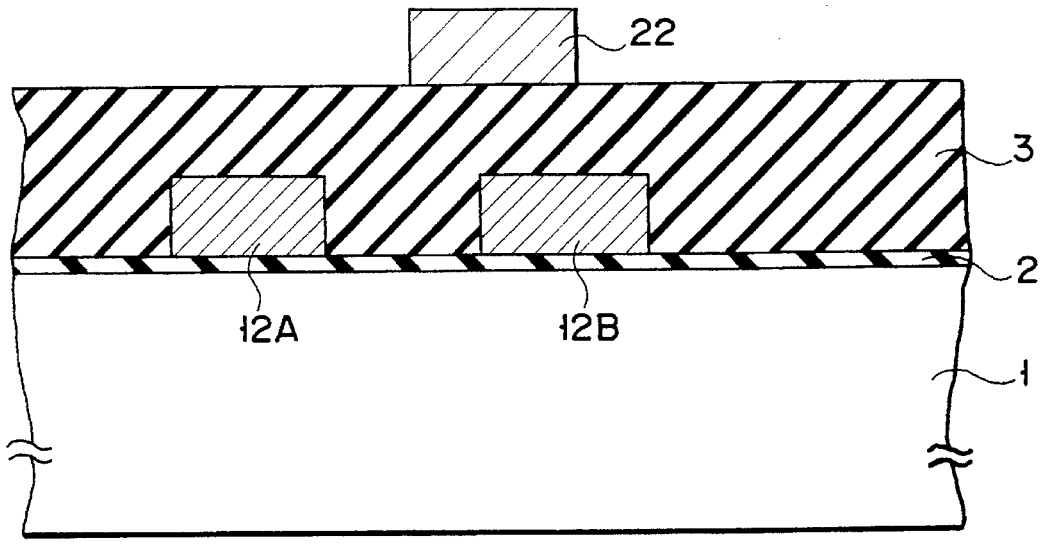
F I G. 11
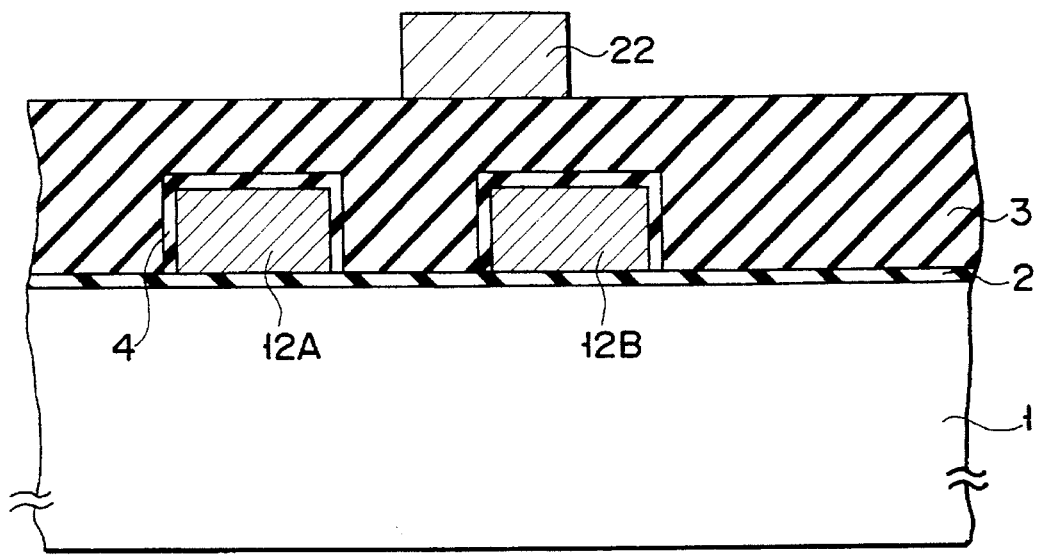
F I G. 12

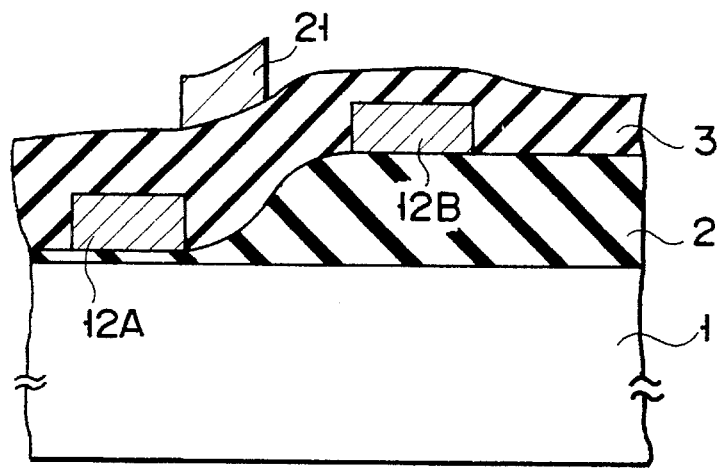
F I G. 13
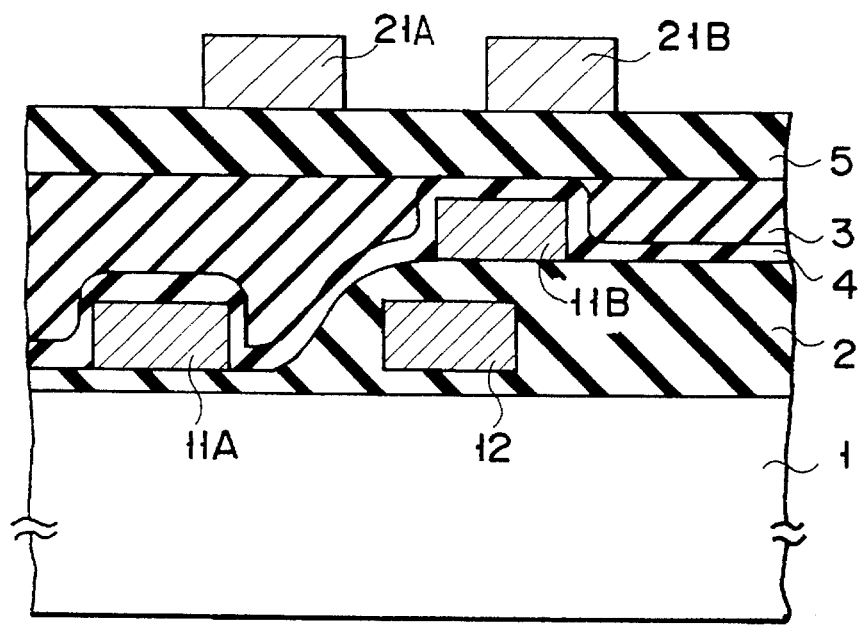
F I G. 14

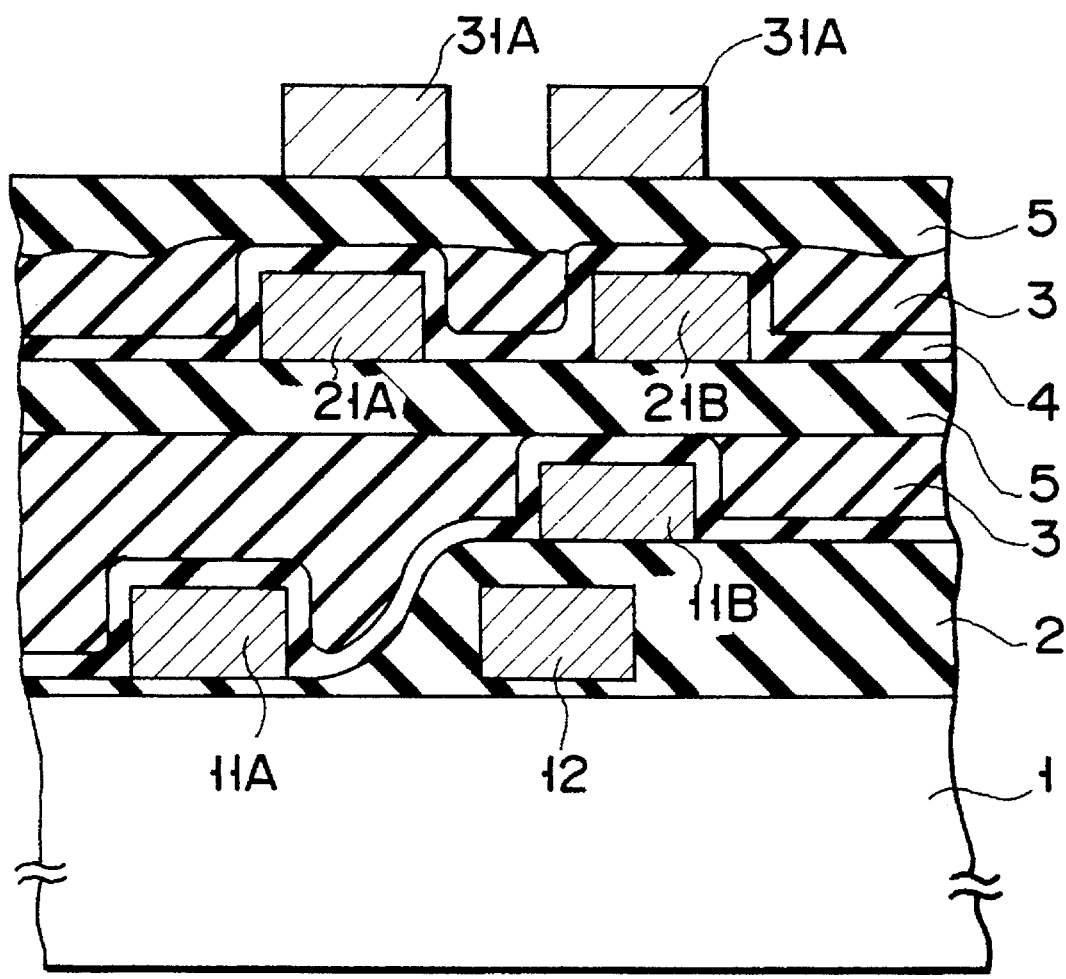
F I G. 15

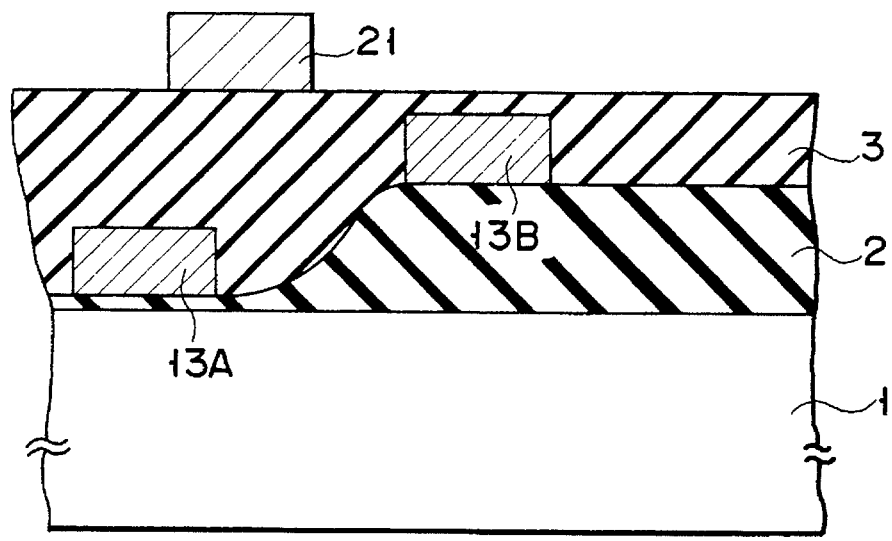
F I G. 16
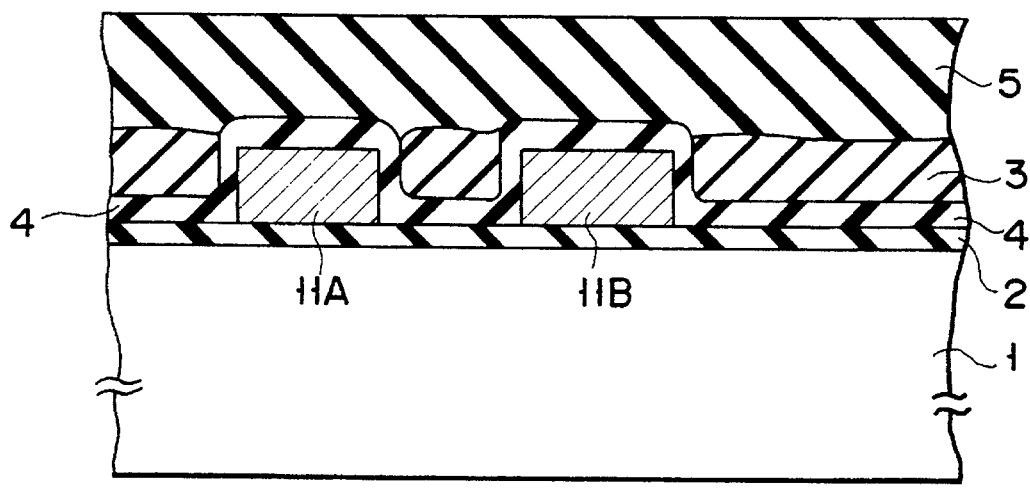
F I G. 17

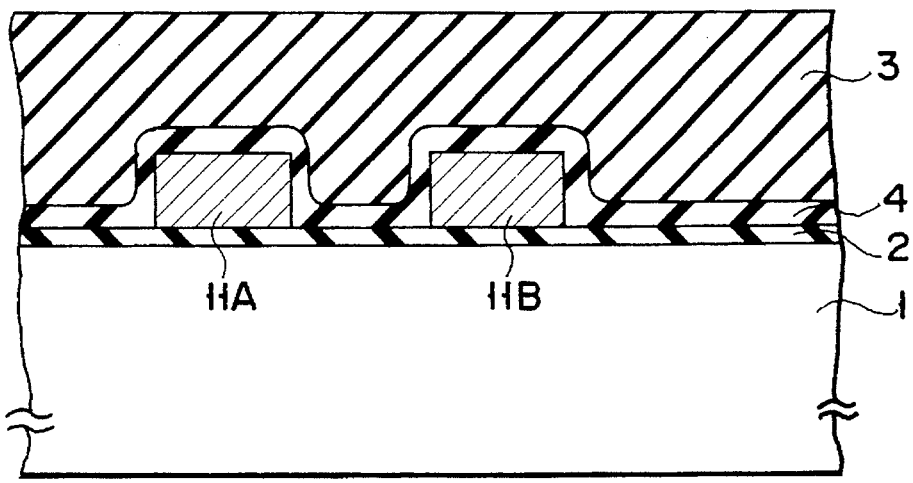
F I G. 18
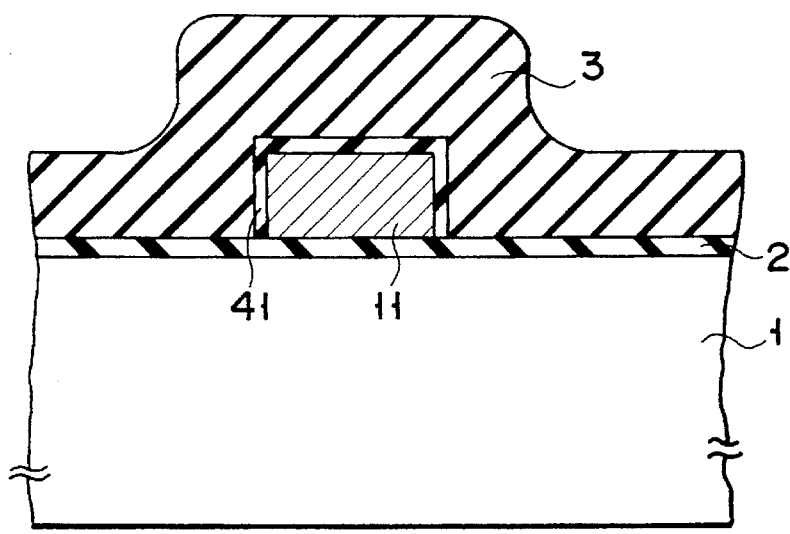
F I G. 19

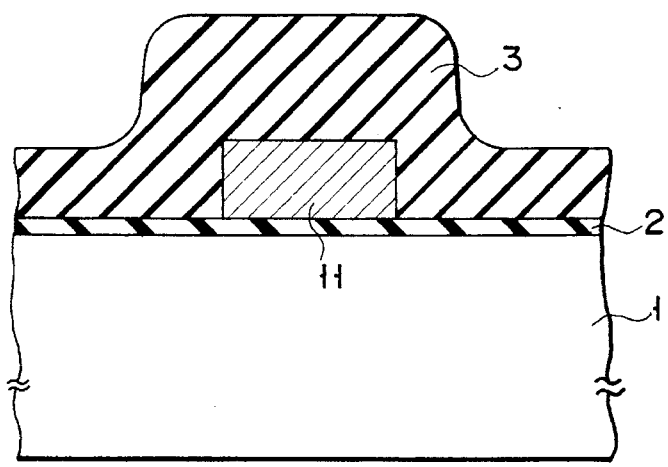
F I G. 20
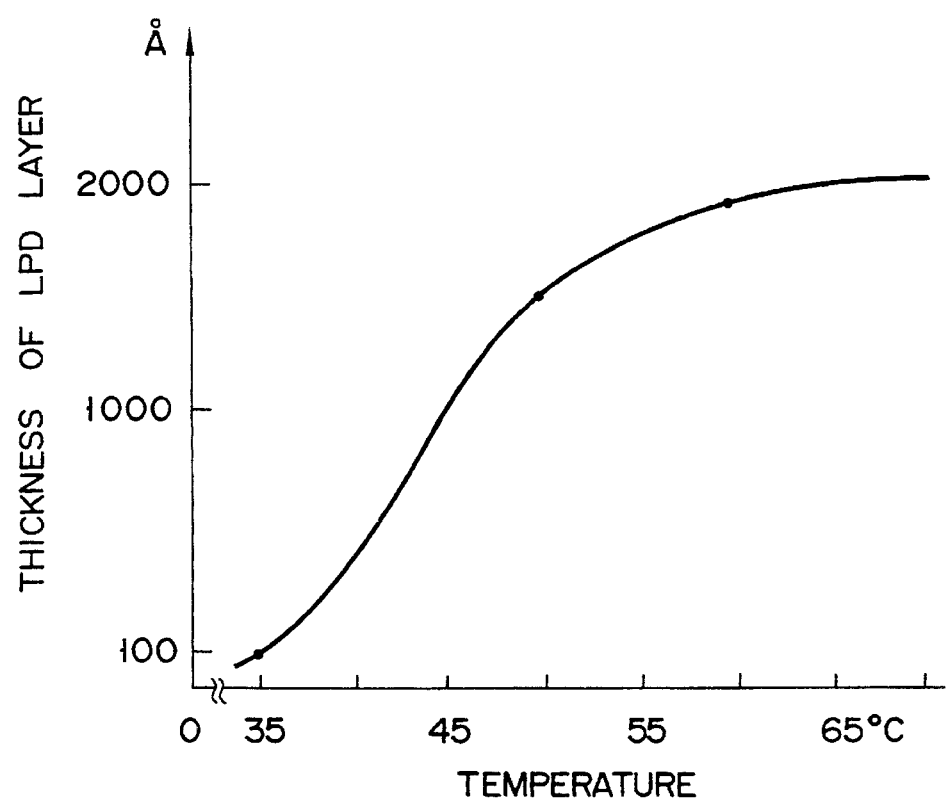
F I G. 21

SEMICONDUCTOR DEVICE AND METHOD OF MANUFACTURING THE SAME

This application is a continuation of application Ser. No. 08/082,504, filed Jun. 25, 1993, now abandoned, which is a continuation of application Ser. No. 07/984,720, filed Dec. 4, 1992, now abandoned, which is a continuation of Ser. No. 07/679,491, filed Apr. 2, 1991, now abandoned.

BACKGROUND OF THE INVENTION

1. Field of the Invention

The present invention relates generally to a semiconductor device and a method of manufacturing the same, and more particularly to an insulative film of a novel structure formed on a semiconductor substrate and a method of manufacturing the same.

2. Description of the Related Art

A semiconductor device such as an LSI is constituted by a number of circuit elements formed on a semiconductor substrate. In this case, insulative layers having various functions are used in the semiconductor device. For example, the insulative layers are used as a gate insulating layer in a MOSFET, a field insulation layer for separating devices, an interlayer insulating layer for mutually insulating wires (including electrodes) arranged on the same plane or upper and lower wires, or a passivation layer for protecting wires and others.

It is necessary that the insulative layer used in the semiconductor have the following features: high quality of layer, absence of pin holes, high withstand voltage, and low moisture absorption property. On the other hand, high integration density is required for the semiconductor device. To meet this requirement, the width of a wire has been reduced and wires have been formed in multi-layers. In this case, if the interlayer insulative layer under the wire has an uneven surface, severing of wire may occur; thus, it is desirable to flatten the surface of the interlayer insulative layer.

The insulative layer used in the semiconductor device is made mainly of a silicon oxide or a silicon nitride. The characteristics of silicon oxides may vary depending on the methods of producing them. The silicon oxides are classified into: a CVD $SiO_2$ layer formed by means of a CVD process, an SOG (Spin on Glass) layer formed by coating a liquid-phase silicon oxide on a substrate, and a thermal oxide layer formed by means of a thermal oxidizing process.

A conventional semiconductor device using an SOG film as an interlayer insulative film will now be described with reference to FIG. 1.

An insulative layer 2 made of a silicon oxide or the like is formed on a silicon substrate 1. First aluminum wires 11A and 11B are formed on the insulative layer 2. A CVD $SiO_2$ layer 4 is formed on the aluminum wires 11A and 11B. The surface of the layer 4 is made sharply uneven. To correct the unevenness, an SOG layer 6 is formed. The surface of the SOG layer 6 is flattened. A CVD $SiO_2$ layer 5 is deposited on the SOG layer 6.

In the semiconductor device shown in FIG. 1, an interlayer insulative layer is composed of the CVD $SiO_2$ layers 4 and 5 and SOG layer 6. The voltage-withstanding property of the interlayer insulative layer is ensured mainly by the CVD $SiO_2$ layers 4 and 5, and the flatness of the interlayer insulative layer is ensured mainly by the SOG layer 6. A though-hole 8 reaching the aluminum wire 11B of the first layer is formed in the interlayer insulative layer. Second aluminum wires 21A and 21B are formed on the interlayer insulative layer. The first aluminum wiring 11B and the second aluminum wiring 21B are electrically connected to each other through the through-hole 8.

Although the interlayer insulative layer having the above structure has excellent flatness, the SOG layer 6 has moisture-absorbent property; therefore, a baking step or the like must be performed in the manufacturing process. If such a step is not performed, water exudes from the SOG layer 6, for example, when the through-hole 8 is formed. As a result, the electrical conduction between the first aluminum wire 11A and the second aluminum wire 21B is degraded or lost.

Next, a conventional semiconductor device, which does not use an SOG layer as an interlayer insulative layer, will now be described with reference to FIG. 2.

An insulative layer 2 formed of silicon oxide is coated on a silicon substrate 1. First aluminum wires 11A and 11B are formed on the insulative layer 2. Using a plasma CVD process, a CVD $SiO_2$ layer 4 is deposited on the first aluminum wires 11A and 11B. The surface of the CVD $SiO_2$ layer 4 is made sharply uneven. In order to flatten the surface of the CVD $SiO_2$ layer 4, a fluid organic substance, for example, a resist layer, is coated on the CVD $SiO_2$ layer 4. The resultant body is subjected to an etch-back process, under the condition that the etching rate of the CVD $SiO_2$ layer 4 is equal to that of the resist layer. The remaining resist layer is removed. Thus, the surface of the CVD $SiO_2$ layer 4 is flattened. Thereafter, using a plasma CVD process, a CVD $SiO_2$ layer 5 is further formed on the CVD $SiO_2$ layer 4. A through-hole 8 reaching the first aluminum wire 11B is formed in the CVD $SiO_2$ layers 4 and 5. Second aluminum wires 21A and 21B are formed on the CVD $SiO_2$ layer 5. Consequently, the first aluminum wire 11B and the second aluminum wire 21B are electrically connected to each other through the through-hole 8.

According to the above process, the quality of the interlayer insulative layer is excellent; however, the flatness thereof is not satisfactory. Specifically, as is shown in FIG. 3, if the distance between the first aluminum wires 11A and 11B formed on the same plane is small, a cavity 10, which is called "nest", is formed in the CVD $SiO_2$ layers 4 and 5. The cavity 10 makes it difficult to obtain the flat surface of the interlayer insulative layer.

In addition, the interlayer insulative layer may be formed, for example, by a bias sputtering process. In the bias sputtering process, however, sputtering and etching progresses simultaneously. Thus, if the distances between adjacent first aluminum wires differ from each other, the ratio of the degree of sputtering to the degree of etching varies in accordance with the different distances. Thus, since the thickness of the interlayer insulative layer varies in its portions located at spaces, there are problems in the shape of the interlayer insulative layer and the method of controlling the sputtering and etching. Furthermore, the interlayer insulative layer may be formed by means of a thermal oxidizing process. The interlayer insulative layer, formed by the thermal oxidizing process, has few pin holes and a high withstand voltage; however, the thermal oxidizing process requires high-temperature treatment and therefore wires may be damaged. Thus, the interlayer insulative layer formed by the thermal oxidizing process can be used only in limited locations.

SUMMARY OF THE INVENTION

The present invention has been devised in order to solve the above problems, and its object is to provide a novel semiconductor device and a method of manufacturing the semiconductor device, which has less pinholes, a high withstand voltage, an excellent quality of layers, and a flat surface.

In order to achieve the above object, a semiconductor device of this invention comprises: a semiconductor substrate; a first insulative layer formed on the semiconductor substrate; a plurality of lower wires formed on the first insulative layer; a second insulative layer covering at least said plurality of lower wires; and a third insulative layer of an inorganic oxide precipitated from a liqid-phase material, said third insulative layer filling at least a pag between said plurality of lower wires.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a cross-sectional view showing a semiconductor device according to the present invention;

FIGS. 5A to 5C are cross-sectional views illustrating a process of manufacturing the semiconductor device according to the present invention;

FIG. 6 is a detailed cross-sectional view showing the process of manufacturing the semiconductor device of the present invention;

FIG. 7 is a schematic view showing an apparatus for manufacturing an LPD layer;

FIGS. 11 to 20 are cross-sectional views showing semiconductor devices of the present invention; and FIG. 21 is a graph showing the relationship between the reaction temperature and the thickness of the LPD layer.

DETAILED DESCRIPTION OF THE PREFERRED EMBODIMENTS

Figure 1:
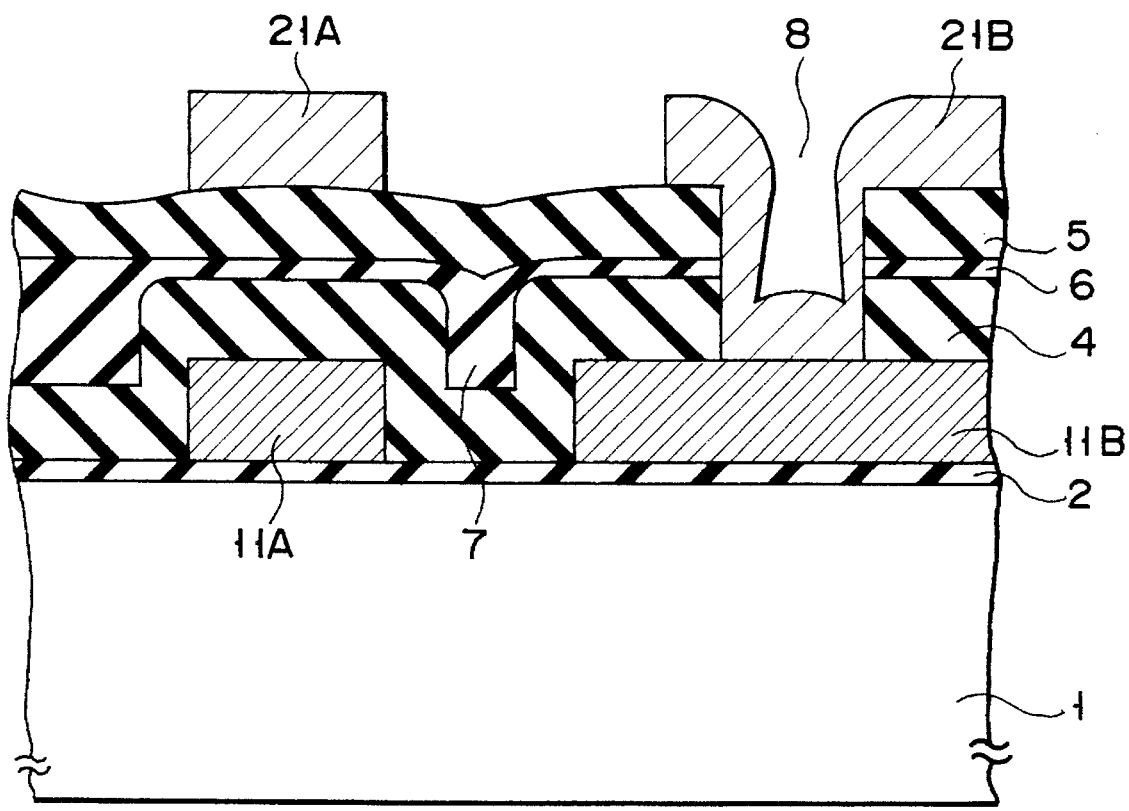
FIGS. 1 to 3 are cross-sectional views showing conventional semiconductor devices.
Figure 2:
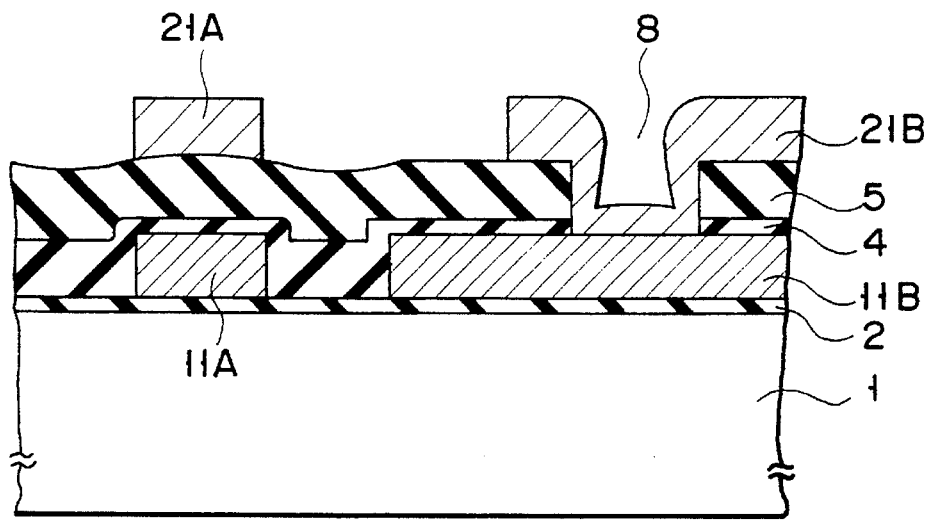
Figure 3:
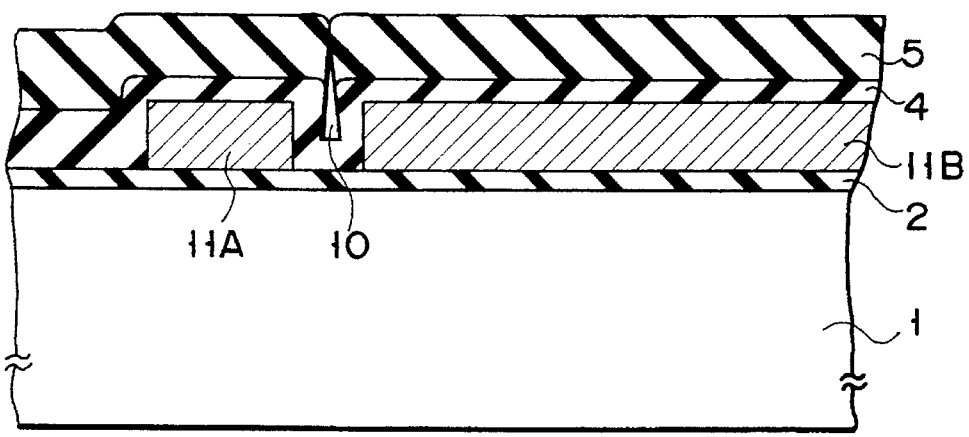

Embodiments of the present invention will now be described with reference to the accompanying drawings. Throughout the specification, similar structural parts are denoted by like reference numerals.

FIG. 4 shows a semiconductor device according to an embodiment of the invention. An insulative layer 2 formed of, for example, silicon oxide, is coated on a silicon substrate 1. First aluminum wires 11A and 11B are formed on the insulative layer 2. A CVD SiO₂ layer 4 is formed on the aluminum wires 11A and 11B by means of, for example, a plasma CVD process. The thickness of the CVD SiO₂ layer 4 is, for example, ¼ or less of a minimum wiring interval of the first aluminum wires (about 1000 Å).

An insulative layer (hereinafter, referred to as liquid phase-deposited or "LPD layer") 3 formed of an inorganic oxide precipitated from a liquid solution, which characterizes the present invention, is formed on the SiO₂ layer 4. The LPD layer 3 is produced in the following manner: a saturated solution of an inorganic oxide, e.g. a solution in which an inorganic oxide is dissolved in hydrofluoric acid, is prepared, and the saturated solution is changed to a supersaturated solution, and then the inorganic oxide is precipitated on the semiconductor substrate. The inorganic oxide is, for example, silicon oxide, tantalum oxide, tungsten oxide, etc. Since the LPD layer 3 has perfect coverage, a "nest" is not formed between the first aluminum wires 11A and 11B. The surface of the LPD layer 3 is flat. In addition, the quality of the LPD layer 3 is higher than that of an SOG layer, etc.

A CVD SiO₂ layer 5 is formed on the LPD layer 3. The voltage-withstanding property of the interlayer insulative layer is ensured by the CVD SiO₂ layers 4 and 5, and the flatness thereof is ensured by the LPD layer 3. Second aluminum wires 21A and 21B are formed on the CVD SiO₂ layer 5.

Figure 5B:
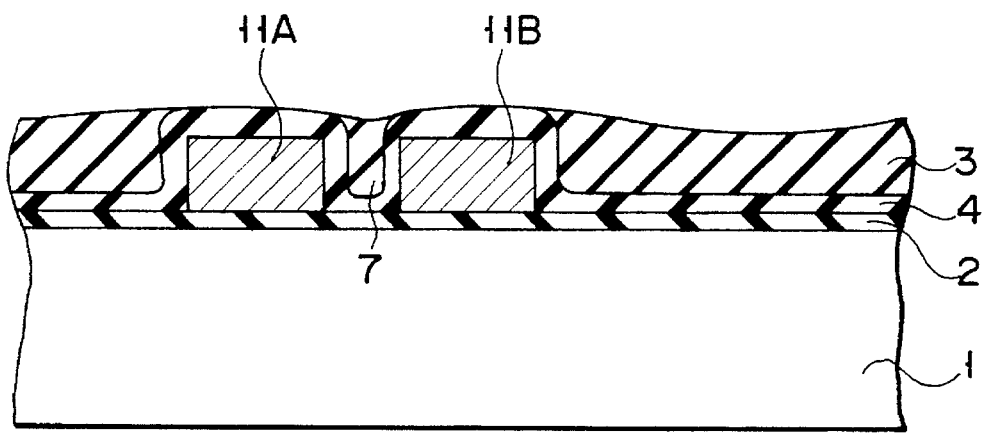
Figure 5C:
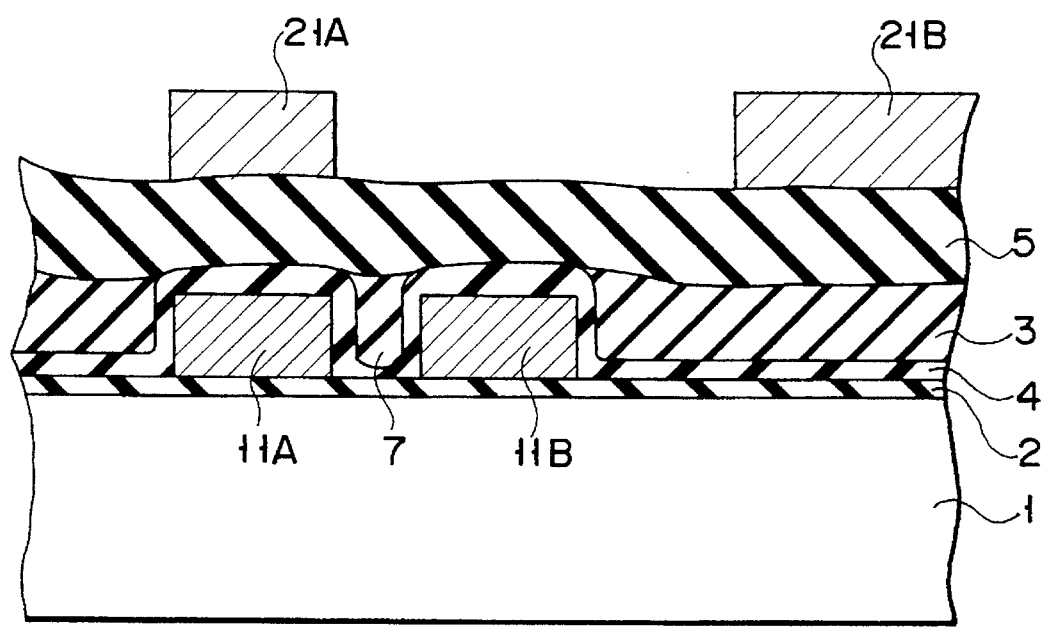

FIGS. 5A to 5C illustrate the process of manufacturing the semiconductor device according to the embodiment of the present invention. As is shown in FIG. 5A, the surface of silicon substrate 1 is subjected to thermal oxidation, thereby forming insulative layer 2 of silicon oxide or the like on the surface of the silicon substrate 1. First aluminum wires 11A and 11B are formed on the insulative layer 2. Using the plasma CVD process, CVD SiO₂ layer 4 is deposited on the first aluminum wires 11A and 11B to a thickness of about 1,000 Å. LPD layer 3 is deposited on the CVD SiO₂ layer 4 at a temperature of 35° C. The LPD layer 3 completely fills in recess 7 between the aluminum wires 11A and 11B. An organic substance such as a resist is coated on the LPD layer 3 and dried, thereby forming resist layer 20.

As is shown in FIG. 5B, an etch-back process is carried out under the condition that the etching rate of the LPD layer 3 is equal to that of the resist layer 20. The remaining resist layer 20 is completely removed. The LPD layer 3, which projects above the aluminum wires 11A and 11B, is etched and the CVD SiO₂ layer 4 is exposed partially.

Subsequently, as is shown in FIG. 5C, CVD SiO₂ layer 5 is formed on the CVD SiO₂ layer 4 and the LPD layer 3. Second aluminum wires 21A and 21B are formed on the CVD SiO₂ layer 5.

Referring to FIG. 6, the process of forming the LPD layer 3 will now be described in greater detail. The CVD SiO₂ layer 4 formed by plasma CVD has a cusp shape 30 at the bottom of the recess 7 between the first aluminum wires 11A and 11B. If the LPD layer 3 having complete coverage property is deposited on the CVD SiO₂ layer 4, the recess 7 between the aluminum wires 11A and 11B can be filled, as indicated by broken lines, without forming "nest". The inorganic oxide solution used in this invention, which contains a solvent such as hydrofluoric acid, has a very low viscosity and fluidity close to that of water. Thus, the inorganic oxide solution can completely fill the recess 7 having cusp shape 30.

In the above embodiment, the interlayer insulative layer comprises the LPD layer 3 and CVD SiO₂ layers 4 and 5. For example, the CVD SiO₂ layers 4 and 5 may be replaced by an SiO₂ layer formed by means of an ECR-CVD process or a sputtering process.

FIG. 7 shows an apparatus for manufacturing the LPD layer on the silicon substrate. Referring to FIG. 7, the process of forming the LPD layer on the silicon substrate will now be described in detail. Silicon oxide is used for the inorganic oxide, and hydrofluoric acid is used for the solvent for dissolving the silicon oxide.

A silicon oxide formed by means of the following method is known as a liquid-phase-deposited $SiO_2$.

Silicon oxide is added to hydrofluoric acid to form a saturated solution of silicon oxide. In this case, the temperature of the saturated solution of silicon oxide is about 35° C. The saturated solution of silicon oxide is expressed by the following reaction formula:

$$H_2SiF_6 + 2H_2O \longleftrightarrow SiO_2 + 6HF \quad (1)$$

The saturated solution of silicon oxide is put in first and second tanks 41 and 42. Then, an aluminum plate 43 is put in the first tank 41. As can be seen from the following formula (2), the aluminum plate 43 reacts with hydrofluoric acid to generate aluminum fluoride and hydrogen:

$$2Al + 6HF \rightarrow 2AlF_3 + 3H_2 \quad (2)$$

The HF in formula (1) is consumed by the reaction with the aluminum plate 43. As a result, the reaction expressed in reaction formula (1) occurs in the direction from the left side to the right, as given by the following formula:

$$H_2SiF_6 + 2H_2O \longleftrightarrow SiO_2 + 6HF \quad (3)$$

The amount of $SiO_2$ becomes excessive, and a supersaturated solution 44 of silicon oxide is formed.

The supersaturated silicon oxide solution 44 is fed from the first tank 41 to the second tank 42 through a pipe 46. The pipe 46 is provided with a filter 47, and impurities in the solution 44 is removed by the filter 47.

A saturated solution 48 of silicon oxide is put in the second tank 42. A board 49 on which a plurality of silicon substrates 1 are mounted is placed in the second tank 42. Thereafter, the supersaturated silicon oxide solution 44 is supplied to the second tank 42. The excessive silicon oxide is deposited on the silicon substrate 1 and consumed. As a result, the supersaturated silicon oxide solution 44 is restored to the saturated state once again, and returned into the first tank 41 for reuse.

The process using the above apparatus is only an example, and various processes may be used to precipitate the inorganic oxide from liquid phase. The material which brings the silicon oxide solution into the saturated condition is not limited to aluminum, but a metal such as titanium or boric acid may be used. When the boric acid is used, the reaction expressed by formula (4) takes place. Specifically, the HF in formula (1) is consumed, $SiO_2$ becomes excessive, and the supersaturated solution 44 of silicon oxide is produced.

$$H_3BO_3 + 9HF \longleftrightarrow H_3O^+ + BF_4^- + 2H_2O \quad (4)$$

Figure 8:
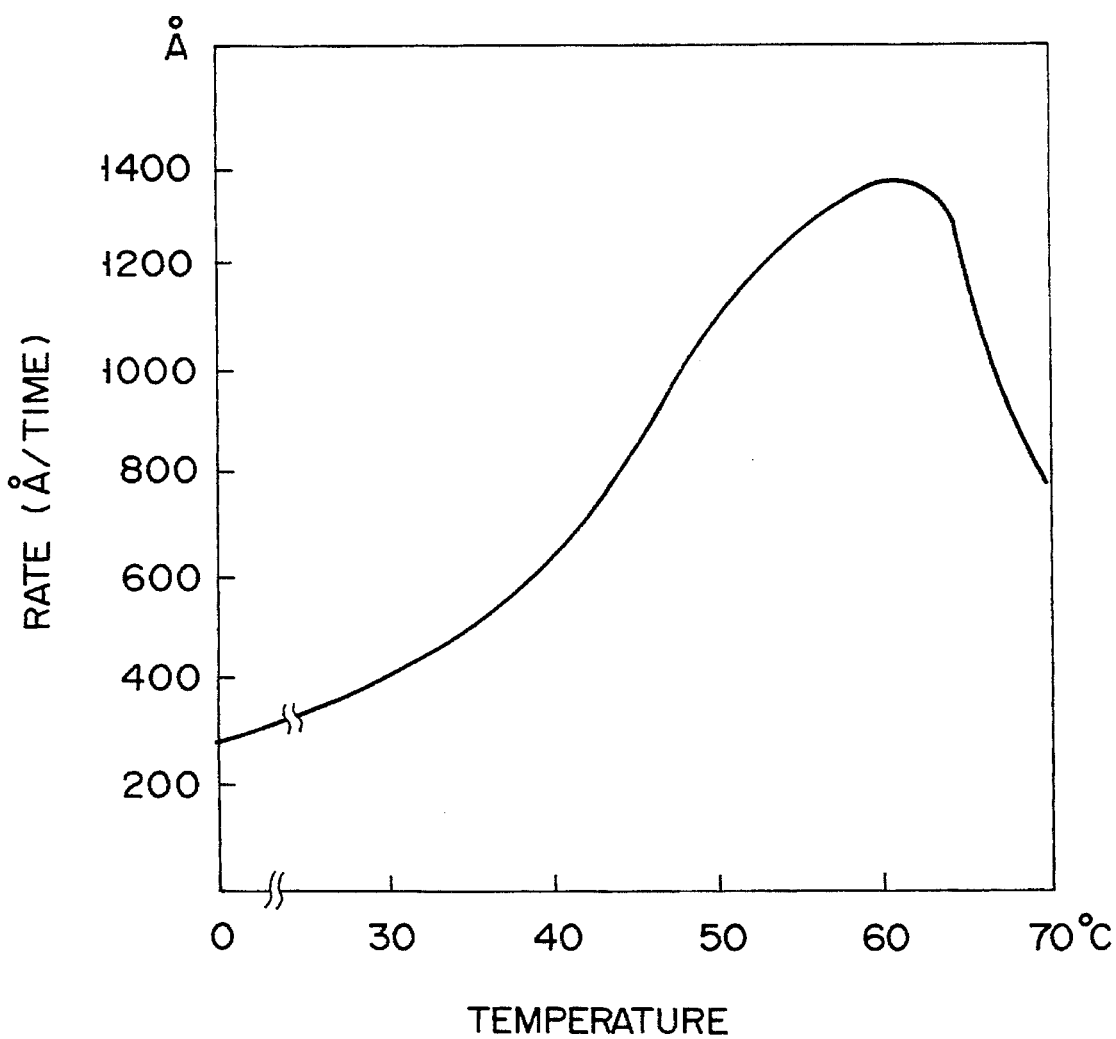
FIG. 8 illustrates the relationship between the reaction temperature and the rate at which the LPD layer is formed.

A description will now be given of the relationship between the temperature of the supersaturated silicon oxide solution and the rate at which the LPD layer is formed. FIG. 8 shows the relationship between the temperature of the silicon oxide solution and the rate at which the LPD layer is formed. The saturated silicon oxide solution has the composition in which HF is 82 wt %, $H_2O$ is 11 wt % and $SiO_2$ is 7 wt %. The material by which the silicon oxide is supersaturated is four aluminum plates each having the size of 10×10 cm. The rate at which the LPD layer is formed reaches a maximum value when the temperature of the solution is about 60° C., and suddenly decreases when the temperature exceeds 60° C. When the temperature exceeds 70° C., evaporation of $SiF_4$ starts and the concentration of Si in the solution decreases. Thus, the efficiency for forming the LPD layer lowers. Thus, it is desirable that the temperature (reaction temperature) of the solution is 70° C. or less.

Figure 9:
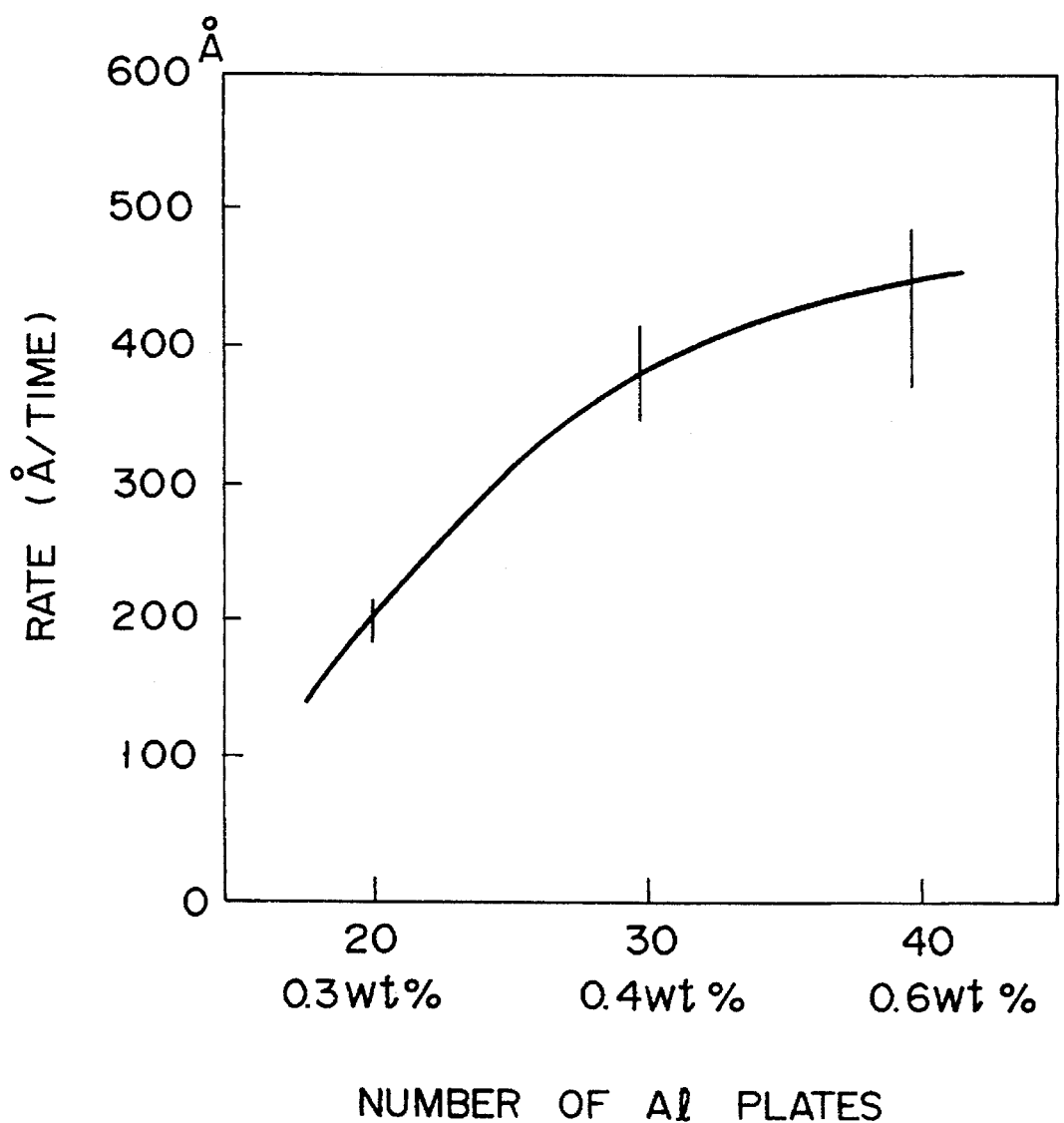
FIG. 9 illustrates the relationship between the quantity of aluminum to be supplied and the rate at which the LPD layer is formed.

FIG. 9 shows the relationship between the rate at which the LPD layer is formed and the number of aluminum plates put in the solution. The temperature of the solution is 35° C. The size of the aluminum plate is 5×5 cm. 20 aluminum plates correspond to 0.3 wt % of the solution. As can be seen from FIG. 9, the rate at which the LPD layer is formed increases as the quantity of aluminum increases.

Figure 10:
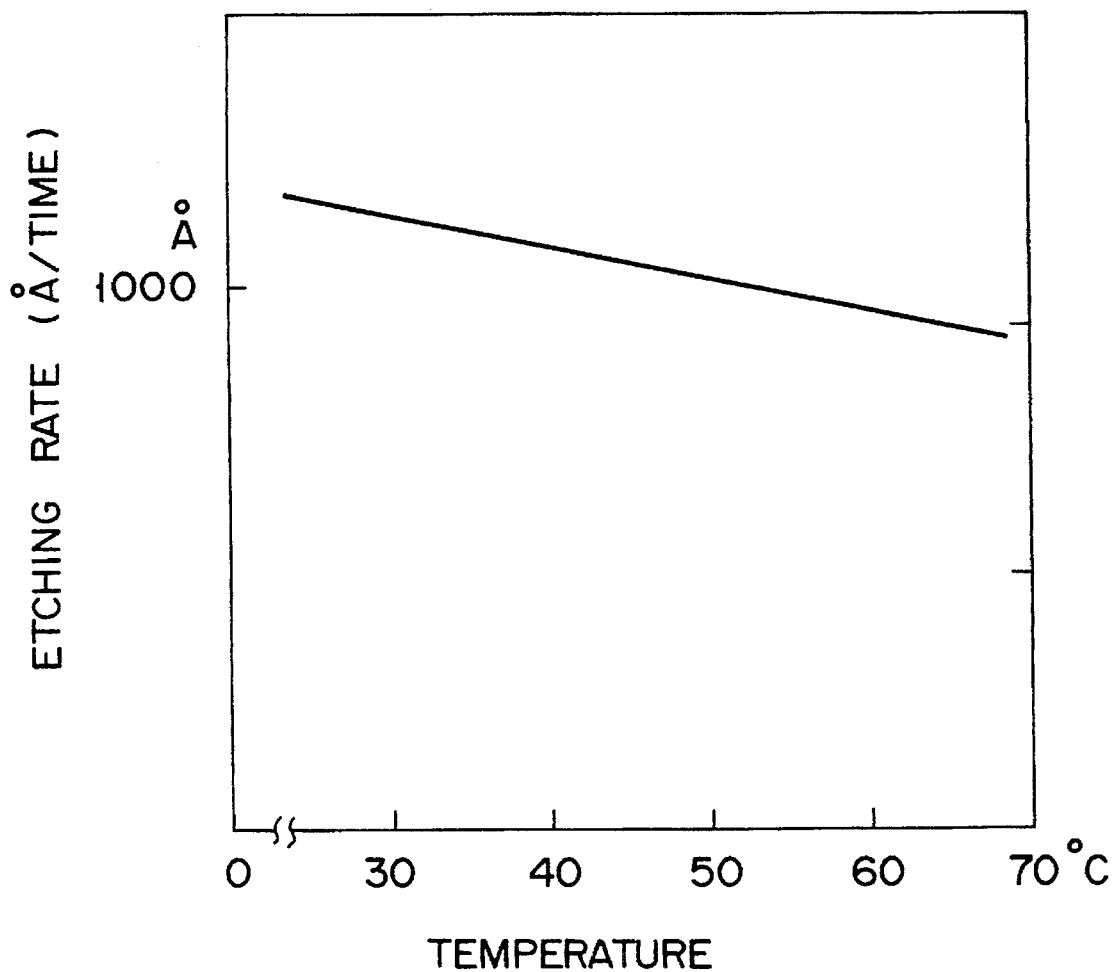
FIG. 10 shows the etching characteristics of the LPD layer.

The etching characteristic of the LPD layer will now be described. FIG. 10 indirectly shows the degree of the quality of the LPD layer. In FIG. 10, the ordinate indicates the rate of etching in the case where the LPD layer is etched in an etching solution including 10 wt % of $NH_4F$, and the abscissa indicates the reaction temperature (temperature of solution). The etching rate is 1,200 Å/min when the temperature of the solution is 35° C., and is 1,130 Å/min when the temperature of the solution is 45° C. The higher the temperature of the solution, the higher the quality of the LPD layer.

The other characteristics of the LPD layer will now be described. A CVD $SiO_2$ layer formed by means of a plasma CVD process and a thermal oxide layer formed by means of a thermal oxidation process were compared with the LPD layer of the present invention. The impurity concentration was high in the CVD $SiO_2$ layer and low in the LPD layer and thermal oxide layer. The withstand voltage was 5 MV/cm in the CVD $SiO_2$ layer, 10 MV/cm in the LPD layer, and 20 MV/cm in the thermal oxide layer. The resistance to wet etching was 3,000 Å/min in the CVD $SiO_2$ layer, and was 1,000 Å, both in the LPD layer and the thermal oxide layer. As can be seen from these results, the LPD layer has a high quality substantially equal to the quality of the thermal oxide layer. In addition, the LPD layer is formed at a much lower temperature than the thermal oxide layer, for example, at 70° C. or less; thus, when the LPD layer is formed, other parts are not damaged.

Embodiments wherein the LPD layer is used as the interlayer insulative layer between polysilicon wires will now be described with reference to FIGS. 11 to 16.

Referring to FIG. 11, an insulative layer 2 such as a thermal oxide layer is formed on a silicon substrate 1. First polysilicon wires 12A and 12B are formed on the insulative layer 2. The polysilicon is not corroded by hydrofluoric acid which is the solvent of the inorganic oxide solution. Thus, in particular, it is not necessary to form a protection layer for protecting the first polysilicon wires 12A and 12B. Then, an LPD layer 3, which characterizes the present invention, is formed so as to cover the polysilicon wires 12A and 12B. Thereafter, an etch-back process is carried out, and the surface of the LPD layer 3 is flattened. A second polysilicon wire 22 is formed on the LPD layer 3.

In the above structure, since the interlayer insulative layer is formed only of the LPD layer 3, the manufacturing process can be simplified, and the withstand voltage can be increased.

Referring to FIG. 12, the embodiment shown in FIG. 12 differs from that of FIG. 11 in that a protection layer 4 is formed on first polysilicon wires 12A and 12B. As has been described in connection with the embodiment of FIG. 11, since the polysilicon is not corroded by hydrofluoric acid, it is not necessary, in particular, to provide the protection layer 4. However, by virtue of the protection layer 4, the breakdown voltage can be increased. The protection layer 4 is a silicon oxide layer obtained by oxidizing the surface of, for example, the polysilicon wires 12.

In the embodiments of FIGS. 11 and 12, an undoped CVD $SiO_2$ layer or a CVD $SiO_2$ layer doped with boron (B) or phosphorus (P) can be formed between the LPD layer 3 and the second polysilicon wires 22. In addition, the LPD layer 3 may be used as an interlayer insulative layer, without being etched back. Furthermore, the polysilicon wires may be replaced by silicide wires or polycide wires.

FIG. 13 shows an embodiment wherein the thickness of insulative layer 2 on the silicon substrate 1 varies partly. In this case, the surface of the insulative layer 2 is uneven. Thus, first polysilicon wire 12A formed on the lower part of the insulative layer 2 and first polysilicon wire 12B formed on the higher part of the layer 2 have different levels. Thus, first, an LPD layer 3 is deposited on the polysilicon wires 12A and 12B to a thickness of about 1 μm. Then, the LPD layer 3 is etched back to a thickness of 0.5 μm to flatten the surface of the LPD layer 3. Finally, second aluminum wires 21 are formed on the LPD layer 3.

In the embodiment of FIG. 13, a protection layer, for example, a thermal oxidation layer obtained by thermally oxidizing the surface of the polysilicon wires 12A and 12B may be formed on the surface of the first polysilicon wires 12A and 12B. If the protection layer is provided, the breakdown voltage can be improved. An undoped CVD $SiO_2$ layer or a CVD $SiO_2$ layer doped with an impurity may be formed between the LPD layer 3 and the second aluminum wire 21. In addition to the thermal oxide layer, a CVD $SiO_2$ layer may be used as the protection layer. In this case, the CVD $SiO_2$ layer is formed on the entire surface of the substrate 1.

In the embodiment shown in FIG. 14, like that of FIG. 13, the thickness of the insulative layer 2 on the silicon substrate 1 varies partly. In FIG. 14, polysilicon wire 12 is buried in the insulative layer 2, and aluminum wires 11A and 11B are formed on the insulative layer 2. First, a protection layer, for example, a CVD $SiO_2$ layer 4 is formed on the aluminum wires 11A and 11B. LPD layer 3 is deposited on the CVD $SiO_2$ layer 4 to a thickness of about 1 μm. Then, in order to flatten the surface of the LPD layer 3, an etch-back process is carried out to a degree of 0.5 μm. As a result, the LPD layer 3 on the wire 11B is removed, and the CVD $SiO_2$ layer 4 is partly exposed. Then, a CVD $SiO_2$ layer 5 is formed over the LPD layer 3 and CVD $SiO_2$ layer 4. Second aluminum wires 21A and 21B are formed on the CVD $SiO_2$ layer 5. It is possible to form aluminum wires 21A and 21B on the LPD layer 3 and CVD $SiO_2$ layer 4, without providing the CVD $SiO_2$ layer 5.

FIG. 15 shows an embodiment wherein three wiring layers are formed. The structure including up to the second wires is the same as that shown in FIG. 14. A protection layer, for example, a CVD $SiO_2$ layer 4 is formed on the second aluminum wires 21A and 21B. An LPD layer 3 is deposited on the CVD $SiO_2$ layer 4 to a thickness of about 1 μm. In order to flatten the surface of the LPD layer 3, an etch-back process is applied to the LPD layer 3 to a thickness of 0.5 μm. Then, a CVD $SiO_2$ layer 5 is formed over the substrate 1. Third aluminum wires 31A and 31B are formed on the CVD $SiO_2$ layer 5. It is also possible to form the aluminum wires 31A and 31B on the LPD layer 3 and CVD $SiO_2$ layer 4, without forming the CVD $SiO_2$ layer 5.

FIG. 16 shows an embodiment in which two types of wires, i.e. aluminum wire and other metal wire, are used. An LPD layer 3 is formed on first tungsten wires 13A and 13B. The formed LPD layer 3 is etched back, such that the tungsten wire 13B situated at the higher level is not exposed from the LPD layer 3. A second aluminum wire 21 is formed on the LPD layer 3. Only the LPD layer 3 is present between the tungsten wires 13A and 13B.

The aluminum wires described above are not limited to aluminum wires; for example, the wires may be formed of an aluminum alloy such as Al-Si-Cu.

Referring to FIG. 17, an embodiment wherein the LPD layer is used as a passivation layer will now be described. An insulative layer 2, e.g. a thermal oxide layer, is formed on the silicon substrate 1. First aluminum wires 11A and 11B are formed on the insulative layer 2. A protection layer, e.g. a CVD $SiO_2$ layer 4, is formed on the aluminum wires 11A and 11B by means of, e.g. a plasma CVD process. An LPD layer 3 is deposited on the CVD $SiO_2$ layer 4. Thereafter, a CVD $SiO_2$ layer 5 is formed on the LPD layer 3 by means of, e.g. a plasma CVD process. As is shown in FIG. 18, only the LPD layer 3 may be formed on the CVD $SiO_2$ layer 4.

Aluminum and an alloy thereof are corrosive metals which are liable to be corroded by an acid. When the LPD layer is formed, it is necessary to provide means for preventing the corrosive metal from directly contacting a solution of hydrofluoric acid. An example of this means is employed where the CVD $SiO_2$ layer 4 is formed on the aluminum wires 11A and 11B (e.g. in FIGS. 17 and 18). The protection layer is not limited to CVD $SiO_2$ layer 4; it may be an $Si_3N_4$ layer formed by means of plasma CVD to a thickness of about 1000 Å. Further, the protection layer may be an organic high-molecular layer formed by means of plasma polymerization or deposition polymerization, for example, a polyethylene layer or polyimide layer.

FIG. 19 shows, as protection layer, an anti-corrosion layer 41 formed by means of, e.g. a selective W (tungsten)-CVD process to a thickness of about 500 Å. Since no pinholes are formed in the layer 41, the wire 11 is surely protected. Further, a nickel layer or molybdenum layer formed by electroless plating may be used as the protection layer. The nickel layer, however, is rougher than the tungsten layer and therefore less advantageous.

FIG. 20 shows an embodiment wherein an $Al_2O_3$ layer is formed in the surface portion of aluminum wire 11 by means of, e.g. a plasma oxidizing process, thereby protecting the wire 11 against corrosion. The $Al_2O_3$ protection layer is formed on the aluminum wire 11 to a thickness of about 1,000 Å. The material of the protection layer is not limited to $Al_2O_3$; a nitride (e.g. AlN) may be employed.

The means for protecting the wire is not limited to the provision of the protection layer, but may be the process of neutralizing a reaction liquid such as a hydrofluoric acid solution. Where the reaction liquid is a hydrofluoric solution, the pH thereof is 1 or less; therefore, the aluminum wire is easily dissolved. Thus, an alkali neutralizing agent such as choline is put in the hydrofluoric solution and the pH is set to 7. As a result, the corrosion of the aluminum wire can be prevented.

An inorganic oxide can be precipitated only by increasing the temperature of the reaction liquid. Specifically, the amount (hereinafter referred to as "saturation amount") of $SiO_2$ which can be dissolved in 1000 cc of hydrofluoric acid is about 300 g when the temperature of hydrofluoric acid is 25° to 30° C. The saturation amount decreases as the temperature of hydrofluoric acid decreases. Accordingly, an inorganic oxide can be precipitated on a silicon substrate by an amount corresponding to the decrease of the saturation amount. In an experiment, the temperatures of hydrofluoric acid solutions in which $SiO_2$ was saturated at about 5° C.

were increased to 35° C., 50° C. and 60° C., respectively, and were kept for five hours. It was found that an LPD layer having a thickness of about 1,000 Å was formed on the silicon substrate where the temperature of the solution was 35° C., an LPD layer about 1,500 Å thick was formed where the temperature was 50° C., and an LPD layer about 1,900 Å thick was formed where the temperature was 60° C.

As has been stated above, when the LPD layer was used as the insulative layer of the semiconductor device, there is no need to perform a thermal treatment process and the insulative layer of high quality was obtained at low temperatures (70° C. or less). Thus, the aluminum wire, which is deformed at about 450° C., is not adversely affected by the formation of the insulative layer. The CVD $SiO_2$ layer is formed at about 380° C., and the CVD $Si_3N_4$ layer is formed at about 400° C.; therefore, if the LPD layer, CVD $SiO_2$ layer and $Si_3N_4$ layer are combined as the insulative layer of the semiconductor device, the process can be carried out at low temperatures. Compared to the SOG layer, the LPD layer has a sufficiently low contraction coefficient and an excellent adhesion with the wire; therefore, accidents of short-circuit hardly occur.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate;

a first insulative layer formed on said semiconductor substrate;

a plurality of wires arranged on said first insulative layer, said plurality of wires being formed of polysilicon; and a liquid-phase-deposited (hereinafter, LPD) layer, said LPD layer completely filling only a gap between at least two of said plurality of wires, said LPD layer comprising one of silicon oxide, tungsten oxide, and tantalum oxide.

2. A semiconductor device comprising:

a semiconductor substrate;

a first insulative layer on said semiconductor substrate;

a plurality of wires on said first insulative layer;

an acid-resistant layer comprising an acid-resistant material selected from the group consisting of tungsten, nickel, molybdenum, silicon nitride, silicon oxide, polymide, polyethylene, aluminum nitride, and aluminum oxide, said acid-resistant layer covering at least said plurality of wires;

a liquid-phase-deposited (hereinafter, LPD) layer, said LPD layer completely filling at least a gap between at least two of said plurality of wires, said LPD layer comprising one of silicon oxide, tungsten oxide, and tantalum oxide.

3. A semiconductor device comprising:

a semiconductor substrate;

a first insulative layer formed on said semiconductor substrate;

a plurality of wires arranged on said first insulative layer, said plurality of wires being formed of polysilicon, said plurality of wires forming a large gap and a small gap; and a liquid-phase-deposited (hereinafter, LPD) layer, said LPD layer completely filling only the large gap and the small gap between said plurality of wires, said LPD layer comprising one of silicon oxide, tungsten oxide, and tantalum oxide.

4. A semiconductor device comprising:

a semiconductor substrate;

a first insutative layer formed on said semiconductor substrate, said first insulative layer having an upper portion and a lower portion;

a plurality of wires arranged on said first insulative layer, said plurality of wires being located at least on the upper portion and the lower portion, said plurality of wires being formed of polysilicon; and a liquid-phase-deposited (hereinafter, LPD) LPD layer, said LPD layer completely filling at least a gap between said plurality of wires, said LPD layer covers said plurality of wires, said LPD layer comprising one of silicon oxide, and tantalum oxide.

5. A semiconductor device comprising:

a semiconductor substrate;

a first insulative layer formed on said semiconductor substrate, said first insulative layer having an upper portion and a lower portion;

a plurality of wires arranged on said first insulative layer, said plurality of wires being located at least on the upper portion and the lower portion, said plurality of wires being formed of polysilicon;

a liquid-phase deposited (hereinafter, LPD) layer, said LPD layer completely filling at least a gap between at least two of said plurality of wires, said LPD layer comprising one of silicon oxide, tungsten oxide, and tantalum oxide.

6. A semiconductor device comprising:

a semiconductor substrate;

a first insulative layer formed on said semiconductor substrate;

a plurality of wires arranged on said first insulative layer, said plurality of wires being layers of acid-resistant metal which comprises one of tungsten, nickel, and molybdenum; and a liquid-phase-deposited (hereinafter, LPD) layer, said LPD layer completely filling only a gap between said plurality of wires, said LPD layer comprising one of silicon oxide, tungsten oxide, and tantalum oxide.

7. A semiconductor device comprising:

a semiconductor substrate;

a first insulative layer formed on said semiconductor substrate;

a plurality of wires arranged on said first insulative layer, said plurality of wires being layers of acid-resistant metal which comprises one of tungsten, nickel, and molybdenum, said plurality of wires forming a large gap and a small gap; and a liquid-phase-deposited (hereinafter, LPD) layer, said LPD layer completely filling only the large gap and the small gap, said LPD layer comprising one of silicon oxide, tungsten oxide, and tantalum oxide.

8. A semiconductor device comprising:

a semiconductor substrate;

a first insulative layer formed on said semiconductor substrate, said first insulative layer having an upper portion and a lower portion;

a plurality of wires arranged on said first insulative layer, said plurality of wires being located at least on the upper portion and the lower portion, said plurality of wires being layers of acid-resistant metal which comprises one of tungsten, nickel, and molybdenum; and a liquid-phase-deposited (hereinafter, LPD) layer, said LPD layer completely filling at least a gap between said plurality of wires, said LPD layer covering said plurality of wires, said LPD layer comprising one of silicon oxide, tungsten oxide, and tantalum oxide.

9. A semiconductor device comprising:

a semiconductor substrate;

a first insulative layer formed on said semiconductor substrate, said first insulative layer having an upper portion and a lower portion;

a plurality of wires arranged on said first insulative layer, said plurality of wires being located at least on the upper portion and the lower portion, said plurality of wires being layers of acid-resistant metal which comprises one of tungsten, nickel, and molybdenum; and a liquid-phase-deposited (hereinafter, LPD) layer, said LPD layer completely filling at least a gap between at least two of said plurality of wires, said LPD layer comprising one of silicon oxide, tungsten oxide, and tantalum oxide.

10. A semiconductor device according to claim 1, further comprising a second insulative layer on said LPD layer and on said plurality of wires, and a plurality of wires on said second insulative layer.

11. A semiconductor device according to claim 10, wherein a surface of said second insulative layer is flat.

12. A semiconductor device according to claim 3, further comprising a second insulative layer on said LPD layer and a plurality of wires on said second insulative layer.

13. A semiconductor device according to claim 12, wherein a surface of said second insulative layer is flat.

14. A semiconductor device according to claim 12, wherein a surface of said second insulative layer is flat.

15. A semiconductor device according to claim 4, further comprising a plurality of wires on said LPD layer.

16. A semiconductor device according to claim 15, wherein a surface of said LPD layer is flat.

17. A semiconductor device according to claim 4, further comprising a second insulative layer on said LPD layer and a plurality of wires on said second insulative layer.

18. A semiconductor device according to claim 17, wherein a surface of said second insulative layer is flat.

19. A semiconductor device according to claim 5, further comprising a second insulative layer on said LPD layer and a plurality of wires on said second insulative layer.

20. A semiconductor device according to claim 19, wherein a surface of said second insulative layer is flat.

21. A semiconductor device according to claim 6, further comprising a second insulative layer on said LPD layer and on said plurality of wires, and a plurality of wires on said second insulative layer.

22. A semiconductor device according to claim 21, wherein a surface of said second insulative layer is flat.

23. A semiconductor device according to claim 7, further comprising a second insulative layer on said LPD layer and a plurality of wires on said second insulative layer.

24. A semiconductor device according to claim 23, wherein a surface of said second insulative layer is flat.

25. A semiconductor device according to claim 6, wherein said first insulative layer includes an upper portion and a lower portion;

said plurality of wires are located at least on the upper portion and the lower portion; and said LPD layer covers said plurality of wires.

26. A semiconductor device according to claim 8, further comprising a plurality of wires formed on said LPD layer.

27. A semiconductor device according to claim 26, wherein a surface of said LPD layer is flat.

28. A semiconductor device according to claim 8, further comprising a second insulative layer formed on said LPD layer and a plurality of wires formed on said second insulative layer.

29. A semiconductor device according to claim 28, wherein a surface of said second insulative layer is flat.

30. A semiconductor device according to claim 6, wherein said first insulative layer has an upper portion and a lower portion;

said plurality of wires are located at least on the upper portion and the lower portion; and said LPD fills a gap between at least two of said plurality of wires.

31. A semiconductor device according to claim 9, further comprising a second insulative layer formed on said LPD layer and a plurality of wires formed on said second insulative layer.

32. A semiconductor device according to claim 31, wherein a surface of said second insulative layer is flat.

33. A semiconductor device according to claim 2, wherein said plurality of wires are formed of polysilicon.

34. A semiconductor device according to claim 33, wherein said LPD layer covers said plurality of wires.

35. A semiconductor device according to claim 34, further comprising of plurality of wires formed on said LPD layer.

36. A semiconductor device according to claim 35, wherein a surface of said LPD layer is flat.

37. A semiconductor device according to claim 34, further comprising a second insulative layer on said LPD layer and a plurality of wires formed on said second insulative layer.

38. A semiconductor device according to claim 37, wherein a surface of said second insulative layer is flat.

39. A semiconductor device according to claim 33, wherein said LPD layer fills only the gap between said plurality of wires.

40. A semiconductor device according to claim 39, further comprising a second insulative layer on said LPD layer and on said plurality of wires, and a plurality of wires on said second insulative layer.

41. A semiconductor device according to claim 40, wherein a surface of said second insulative layer is flat.

42. A semiconductor device according to claim 33, wherein said plurality of wires form a large gap and a small gap; and said LPD layer fills the large gap and the small gap, and covers said plurality of wires.

43. A semiconductor device according to claim 42, further comprising a plurality of wires on said LPD layer.

44. A semiconductor device according to claim 43, wherein a surface of said LPD layer is flat.

45. A semiconductor device according to claim 42, further comprising a second insulative layer on said LPD layer and a plurality of wires on said second insulative layer.

46. A semiconductor device according to claim 45, wherein a surface of said second insulative layer is flat.

47. A semiconductor device according to claim 33, wherein said plurality of wires form a large gap and a small gap, and said LPD layer is formed only in the large gap and the small gap, and fills the large gap and the small gap.

48. A semiconductor device according to claim 47, further comprising a second insulative layer on said LPD layer and a plurality of wires on said second insulative layer.

49. A semiconductor device according to claim 48, wherein a surface of said second insulative layer is flat.

50. A semiconductor device according to claim 33, wherein
said first insulative layer has an upper portion and a lower portion;
said plurality of wires are located at least on the upper portion and the lower portion; and
said LPD layer covers said plurality of wires.

51. A semiconductor device according to claim 50, further comprising a plurality of wires on said LPD layer.

52. A semiconductor device according to claim 51, wherein a surface of said LPD layer is flat.

53. A semiconductor device according to claim 50, further comprising a second insulative layer on said LPD layer and a plurality of wires on said second insulative layer.

54. A semiconductor device according to claim 53, wherein a surface of said second insulative layer is flat.

55. A semiconductor device according to claim 33, wherein
said first insulative layer has an upper portion and a lower portion;
said plurality of wires are located at least on the upper portion and the lower portion; and
said LPD layer fills a gap between said plurality of wires.

56. A semiconductor device according to claim 55, further comprising a second insulative layer on said LPD layer and a plurality of wires on said second insulative layer.

57. A semiconductor device according to claim 56, wherein a surface of said second insulative layer is flat.

58. A semiconductor device according to claim 33, wherein said plurality of wires and said LPD layer are out of contact with each other.

59. A semiconductor device according to claim 2, wherein said plurality of wires comprise a corrodible metal corrodible by an acid, said corrodible metal being selected from a group of metals including aluminum.

60. A semiconductor device according to claim 59, wherein said LPD layer covers said plurality of wires.

61. A semiconductor device according to claim 60, further comprising a plurality of wires formed on said LPD layer.

62. A semiconductor device according to claim 61, wherein a surface of said LPD layer is flat.

63. A semiconductor device according to claim 60, further comprising a second insulative layer formed on said LPD layer and a plurality of wires formed on said second insulative layer.

64. A semiconductor device according to claim 63, wherein a surface of said second insulative layer is flat.

65. A semiconductor device according to claim 59, wherein said LPD layer fills only the gap between said plurality of wires.

66. A semiconductor device according to claim 65, further comprising a second insulative layer on said LPD layer and on said plurality of wires, and a plurality of wires on said second insulative layer.

67. A semiconductor device according to claim 66, wherein a surface of said second insulative layer is flat.

68. A semiconductor device according to claim 59, wherein
said plurality of wires form a large gap and a small gap; and
said LPD layer fills the large gap and a small gap, and covers said plurality of wires.

69. A semiconductor device according to claim 68, further comprising a plurality of wires on said LPD layer.

70. A semiconductor device according to claim 69, wherein a surface of said LPD layer is flat.

71. A semiconductor device according to claim 68, further comprising a second insulative layer on said LPD layer and a plurality of wires on said second insulative layer.

72. A semiconductor device according to claim 71, wherein a surface of said second insulative layer is flat.

73. A semiconductor device according to claim 59, wherein
said plurality of wires form a large gap and a small gap; and
said LPD layer is formed only in the large gap and the small gap, and fills the large gap and the small gap.

74. A semiconductor device according to claim 73, further comprising a second insulative layer formed on said LPD layer and a plurality of wires formed on said second insulative layer.

75. A semiconductor device according to claim 74, wherein a surface of said second insulative layer is flat.

76. A semiconductor device according to claim 59, wherein
said first insulative layer has an upper portion and a lower portion:
said plurality of wires are located at least on the upper portion and the lower portion; and
said LPD layer covers said plurality of wires, 77. A semiconductor device according to claim 76, further comprising a plurality of wires on said LPD layer.

78. A semiconductor device according to claim 77, wherein a surface of said LPD layer is flat.

79. A semiconductor device according to claim 76, further comprising a second insulative layer on said LPD layer, and a plurality of wires on said second insulative layer.

80. A semiconductor device according to claim 79, wherein a surface of said insulative layer is flat.

81. A semiconductor device according to claim 59, wherein said first insulative layer has an upper portion and a lower portion;
said plurality of wires are located at least on the upper portion and the lower portion; and
said LPD layer fills a gap between said plurality of wires.

82. A semiconductor device according to claim 81, further comprising a second insulative layer on said LPD layer and a plurality of wires on said second insulative layer.

83. A semiconductor device according to claim 82, wherein a surface of said second insulative layer is flat.

84. A semiconductor device according to claim 59, wherein said plurality of wires and said LPD layer are out of contact with each other.

85. A semiconductor device according to claim 1, wherein said LPD layer is formed at temperatures not more than 70° C.

* * * * *

UNITED STATES PATENT AND TRADEMARK OFFICE
CERTIFICATE OF CORRECTION

PATENT NO.  : 5,552,628
DATED       : September 3, 1996
INVENTOR(S) : Watanabe et al.

It is certified that error appears in the above-identified patent and that said Letters Patent is hereby corrected as shown below:

Claim 2, col. 9, line 15, delete "polymide" and insert --polyimide--.

*Claim 4, col. 10, line 8, delete "insutative" and insert --insulative--.

col. 10, line 15, delete "LPD)LPD layer" and insert --LPD) layer--;

col. 10, line 17, delete "covers" and insert --covering--.

Claim 15, col. 11, line 37, delete "according to claim 4," and substitute therefor --comprising:

a semiconductor substrate;

a first insulative layer formed on said semiconductor substrate;

a plurality of wires arranged on said first insulative layer; and

UNITED STATES PATENT AND TRADEMARK OFFICE
CERTIFICATE OF CORRECTION

PATENT NO. : 5,552,628
DATED : September 3, 1996
INVENTOR(S) : Watanabe et al.

It is certified that error appears in the above-identified patent and that said Letters Patent is hereby corrected as shown below:

a liquid-phase-deposited (hereinafter, LPD) layer, said LPD layer completely filling at least a gap between at least two of said plurality of wires, said LPD layer comprising one of silicon oxide, tungsten oxide, and tantalum oxide;

wherein said plurality of wires are formed of polysilicon;

wherein said first insulative layer has an upper portion and a lower portion;

said plurality of wires is located at least on the upper portion and the lower portion; and said LPD layer covers said plurality of wires; and--.

Claim 17, col. 11, line 41, delete "according to claim 4," and substitute therefor --comprising:

UNITED STATES PATENT AND TRADEMARK OFFICE
CERTIFICATE OF CORRECTION

PATENT NO. : 5,552,628
DATED : September 3, 1996
INVENTOR(S) : Watanabe et al.

It is certified that error appears in the above-identified patent and that said Letters Patent is hereby corrected as shown below:

a semiconductor substrate;

a first insulative layer formed on said semiconductor substrate;

a plurality of wires arranged on said first insulative layer; and a liquid-phase-deposited (hereinafter, LPD) layer, said LPD layer completely filling at least a gap between at least two of said plurality of wires, said LPD layer comprising one of silicon oxide, tungsten oxide, and tantalum oxide;

wherein said plurality of wires are formed of polysilicon;

wherein said first insulative layer has an upper portion and a lower portion;

said plurality of wires is located at least on the upper portion and the lower portion; and said LPD layer covers said plurality of wires; and--.

UNITED STATES PATENT AND TRADEMARK OFFICE
CERTIFICATE OF CORRECTION

PATENT NO. : 5,552,628
DATED : September 3, 1996
INVENTOR(S) : Watanabe et al.

It is certified that error appears in the above-identified patent and that said Letters Patent is hereby corrected as shown below:

Claim 25, col. 11, line 62, delete "according to claim 6," and substitute therefor --comprising:

a semiconductor substrate;

a first insulative layer formed on said semiconductor substrate;

a plurality of wires arranged on said first insulative layer; and a liquid-phase-deposited (hereinafter, LPD) layer, said LPD layer completely filling at least a gap between at least two of said plurality of wires, said LPD layer comprising one of silicon oxide, tungsten oxide, and tantalum oxide;

wherein said plurality of wires are layers of acid-resistant metal which comprises one of tungsten, nickel and molybdenum;--.

UNITED STATES PATENT AND TRADEMARK OFFICE
CERTIFICATE OF CORRECTION

PATENT NO. : 5,552,628
DATED : September 3, 1996
INVENTOR(S) : Watanabe et al.

It is certified that error appears in the above-identified patent and that said Letters Patent is hereby corrected as shown below:

Claim 30, col. 12, line 12, delete "according to claim 6," and substitute therefor --comprising:

a semiconductor substrate, a first insulative layer formed on said semiconductor substrate;

a plurality of wires arranged on said first insulative layer; and

UNITED STATES PATENT AND TRADEMARK OFFICE
CERTIFICATE OF CORRECTION

PATENT NO. : 5,552,628
DATED : September 3, 1996
INVENTOR(S) : Watanabe et al.

It is certified that error appears in the above-identified patent and that said Letters Patent is hereby corrected as shown below:

a liquid-phase-deposited (hereinafter, LPD) layer, said LPD layer completely filling at least a gap between at least two of said plurality of wires, said LPD layer comprising one of silicon oxide, tungsten oxide, and tantalum oxide;

wherein said plurality of wires are layers of acid-resistant metal which comprises one of tungsten, nickel and molybdenum;--.

Signed and Sealed this

First Day of September, 1998

Attest:

BRUCE LEHMAN

Attesting Officer

Commissioner of Patents and Trademarks